(12) United States Patent
Xu et al.

(10) Patent No.: US 9,761,794 B2
(45) Date of Patent: Sep. 12, 2017

(54) MAGNETORESISTIVE SENSOR, RELATED MANUFACTURING METHOD, AND RELATED ELECTRONIC DEVICE

(71) Applicant: Semiconductor Manufacturing International (Shanghai) Corporation, Shanghai (CN)

(72) Inventors: Wei Xu, Shanghai (CN); Guoan Liu, Shanghai (CN)

(73) Assignee: Semiconductor Manufacturing International (Shanghai) Corporation (CN)

( * ) Notice: Subject to any disclaimer, the term of this patent is extended or adjusted under 35 U.S.C. 154(b) by 0 days.

(21) Appl. No.: 15/245,556

(22) Filed: Aug. 24, 2016

(65) Prior Publication Data
US 2016/0365507 A1    Dec. 15, 2016

Related U.S. Application Data

(62) Division of application No. 14/668,720, filed on Mar. 25, 2015, now Pat. No. 9,450,178.

(30) Foreign Application Priority Data

Jun. 3, 2014    (CN) .......................... 2014 1 0243222

(51) Int. Cl.
| | | |
|---|---|---|
| *H01L 43/00* | (2006.01) | |
| *H01L 43/08* | (2006.01) | |
| *H01L 43/12* | (2006.01) | |
| *G01R 33/09* | (2006.01) | |
| *H01L 27/22* | (2006.01) | |
| *G01R 33/035* | (2006.01) | |
| *G01R 33/12* | (2006.01) | |

(52) U.S. Cl.
CPC ............ *H01L 43/08* (2013.01); *G01R 33/035* (2013.01); *G01R 33/09* (2013.01); *G01R 33/091* (2013.01); *G01R 33/1276* (2013.01); *H01L 27/22* (2013.01); *H01L 43/12* (2013.01)

(58) Field of Classification Search
CPC ................................ H01L 43/08; H01L 43/12
USPC .......................................................... 257/427
See application file for complete search history.

(56) References Cited

U.S. PATENT DOCUMENTS

| | | |
|---|---|---|
| 6,266,218 B1 | 7/2001 | Carey et al. |
| 6,665,156 B2 | 12/2003 | Miyazawa et al. |
| 6,822,836 B2 | 11/2004 | Gill |

(Continued)

*Primary Examiner* — Theresa T Doan
(74) *Attorney, Agent, or Firm* — Innovation Counsel LLP

(57) ABSTRACT

A method for manufacturing a magnetoresistive sensor may include the following steps: forming a trench structure in a substrate, wherein the step of forming the trench structure comprises performing a wet etching process on a substrate material member, wherein the trench structure has a first side, a second side, and a third side, wherein the second side is connected through the first side to the third side, wherein the second side is at a first obtuse angle with respect to a side of the substrate, and wherein the third side is at a second obtuse angle with respect to the side of the substrate; forming a first magnetic element on the first side of the trench structure; forming a second magnetic element on the second side of the trench structure; and forming a third magnetic element on the third side of the trench structure.

6 Claims, 7 Drawing Sheets

(56) References Cited

U.S. PATENT DOCUMENTS

2006/0176142 A1* 8/2006 Naito ................. G01R 33/0206
                                                     338/32 R
2008/0217288 A1* 9/2008 Breuer ............... G01R 33/0206
                                                       216/22

* cited by examiner

MAGNETORESISTIVE SENSOR, RELATED MANUFACTURING METHOD, AND RELATED ELECTRONIC DEVICE

CROSS-REFERENCE TO RELATED APPLICATION

This is a divisional of U.S. application Ser. No. 14/668,720 filed Mar. 25, 2015, which application claims priority to and benefit of Chinese Patent Application No. 201410243222.6, filed on Jun. 3, 2014, each of which are incorporated herein by reference in their entireties.

BACKGROUND OF THE INVENTION

The present invention is related to a magnetoresistive sensor (or magnetoresistive sensing device), a method for manufacturing the magnetoresistive sensor, and an electronic device that includes the magnetoresistive sensor.

Magnetoresistive sensors may be used for determining parameters related to magnetic fields. Magnetoresistive sensors may be included in electronic devices for various applications, such as navigation, attitude determination, or control.

A magnetoresistive sensor may be manufactured through formation of an array of magnetic elements on a silicon substrate. For the magnetoresistive sensor to satisfy performance requirements, the surface roughness (or flatness) of the magnetic elements may need to meet substantially stringent specifications. In order to achieving a satisfactory manufacturing yield of magnetoresistive sensors, the associated manufacturing cost may be substantially high.

SUMMARY

An embodiment of the present invention may be related to a method for manufacturing a magnetoresistive sensor. The method may include forming a trench structure in a substrate. The step of forming the trench structure may include performing a wet etching process on a substrate material member. The trench structure may have a first side, a second side, and a third side. The second side may be connected through the first side to the third side, and/or the first side may be connected between the second side and the third side. The second side may be at a first obtuse angle with respect to a side (e.g., bottom side) of the substrate. The third side may be at a second obtuse angle with respect to the side of the substrate. The method may further include forming a first magnetic element on the first side of the trench structure. The method may further include forming a second magnetic element on the second side of the trench structure. The method may further include forming a third magnetic element on the third side of the trench structure.

A magnitude of the first obtuse angle may be in a range of 120 degrees to 140 degrees. A magnitude of the second obtuse angle may be in a range of 120 degrees to 140 degrees.

The second side of the trench structure may be at an angle in a range of 120 degrees to 140 degrees with respect to the first side of the trench structure. The third side may be at an angle in a range of 120 degrees to 140 degrees with respect to the first side of the trench structure.

The first magnetic element may be positioned closer to the side (e.g., bottom side) of the substrate than each of the second magnetic element and the third magnetic element.

The substrate may be a semiconductor substrate. At least one of the first magnetic element, the second magnetic element, and the third magnetic element may be positioned between two semiconductor portions of the substrate.

The first magnetic element may be positioned between two portions of a protective layer. The two portions of the protective layer may be positioned between the two semiconductor portions of the substrate.

The second magnetic element may include a first portion and a second portion. The first portion may be positioned on the second side of the trench structure. The second portion may be positioned outside the trench structure, may be directly connected the first portion, and may be at a third obtuse angle with respect to the first portion.

The method may include etching the substrate material member to form an etched trench structure. The method may further include providing (or forming) a protective layer that covers sides of the etched trench structure to form the trench structure. The first magnetic element and the second magnetic element may be formed on the protective layer. The protective layer may be a silicon oxide layer.

The method may include the following steps: before the etching, forming a mask on the substrate material member; and after the etching and before formation of the protective layer, removing the mask.

The wet etching process may include etching the substrate material member using tetramethylammonium hydroxide.

The wet etching process may be performed on the substrate material member for a duration in a range of 29 minutes to 31 minutes, such a duration of 30 minutes.

The first magnetic element may be a portion of a first magnetic material layer. The second magnetic element and the third magnetic element may be portions of a second magnetic material layer.

The method may include the following steps: forming a first photoresist on the substrate; exposing and developing the first photoresist to form a first remaining photoresist that may define a first location; providing a first magnetic material layer on the first location and on the first remaining photoresist; and removing a portion of the first magnetic material layer that is provided on the first remaining photoresist to form a first magnetic material member at the first location. Magnetic material members analogous to the first magnetic material member may be formed when the first magnetic material member is formed.

The method may include the following steps: forming a second photoresist on the substrate; exposing and developing the second photoresist to form a second remaining photoresist that may define a second location and a third location; providing a second magnetic material layer on the second location, on the third location, and on the second remaining photoresist; removing a portion of the second magnetic material layer that is provided on the second remaining photoresist to form a second magnetic material member at the second location and to form a third magnetic material member at the third location. Magnetic material members analogous to the second magnetic material member and the third magnetic material member may be formed when the second magnetic material member and the third magnetic material member are formed.

The method may include etching the first magnetic material member, the second magnetic material member, and the third magnetic material member in a same etching process to form the first magnetic element, the second magnetic element, and the third magnetic element. Analogous magnetic elements may be formed when the first magnetic element, the second magnetic element, and the third magnetic element are formed. The etching process may include ion beam etching.

The method may include providing the first magnetic material member, the second magnetic material member, and the third magnetic material member as the first magnetic element, the second magnetic element, and the third magnetic element.

The method may include forming a metal element that contacts the second magnetic element. A portion of the metal element may be positioned outside the trench structure. The method may include forming a conductive interconnect that contacts the portion of the metal element.

The method may include the following steps: forming a first dielectric layer, which overlaps the conductive interconnect; forming a second dielectric layer on the first dielectric layer; and forming a conductive pad that contacts the conductive interconnect. A portion of the first dielectric layer and a portion of the second dielectric layer may be positioned between the conductive pad and the conductive interconnect.

An embodiment of the present invention may be related to a magnetoresistive sensor. The magnetoresistive sensor may include a substrate that may have a trench structure. The trench structure may have a first side, a second side, and a third side. The second side may be connected through the first side to the third side, and/or the first side may be connected between the second side and the third side. The second side may be at a first obtuse angle with respect to a side (e.g., bottom side) of the substrate. The third side may be at a second obtuse angle with respect to the side of the substrate. The magnetoresistive sensor may further include a first magnetic element, which may directly contact the first side of the trench structure. The magnetoresistive sensor may further include a second magnetic element, which may directly contact the second side of the trench structure. The magnetoresistive sensor may further include a third magnetic element, which may directly contact the third side of the trench structure.

A magnitude of the first obtuse angle may be in a range of 120 degrees to 140 degrees. A magnitude of the second obtuse angle may be in a range of 120 degrees to 140 degrees.

The second side of the trench structure may be at an angle in a range of 120 degrees to 140 degrees with respect to the first side of the trench structure. The third side may be at an angle in a range of 120 degrees to 140 degrees with respect to the first side of the trench structure.

The substrate may be a semiconductor substrate. At least one of the first magnetic element, the second magnetic element, and the third magnetic element may be positioned between two semiconductor portions of the substrate.

The first magnetic element may be positioned between two portions of a protective layer. The two portions of the protective layer may be positioned between the two semiconductor portions of the substrate.

The first magnetic element may be positioned closer to the side (e.g., bottom side) of the substrate than each of the second magnetic element and the third magnetic element. The first magnetic element may correspond to a first Cartesian coordinate direction (e.g., the X direction). The second magnetic element may correspond to a second Cartesian coordinate direction (e.g., the Y direction). The third magnetic element may correspond to a third Cartesian coordinate direction (e.g., the Z direction).

The second magnetic element may include a first portion and a second portion. The first portion may be positioned on the second side of the trench structure. The second portion may be positioned outside the trench structure, may be directly connected the first portion, and may be at a third obtuse angle with respect to the first portion.

An embodiment of the present invention may be related to an electronic device. The electronic device may include an electronic component and may include a magnetoresistive sensor that is electronically connected to the electronic component.

The magnetoresistive sensor may include a substrate, a first magnetic element, a second magnetic element, and a third magnetic element. The substrate that may have a trench structure. The trench structure may have a first side, a second side, and a third side. The second side may be connected through the first side to the third side. The second side may be at a first obtuse angle with respect to a side (e.g., bottom side) of the substrate. The third side may be at a second obtuse angle with respect to the side of the substrate. The first magnetic element may directly contact the first side of the trench structure. The second magnetic element may directly contact the second side of the trench structure. The third magnetic element may directly contact the third side of the trench structure.

According to embodiments of the invention, the wet etching process may enable satisfactory control of inclination angles of sides of trench structures. Therefore, orientations of magnetic elements positioned on the sides of the trench structures may be substantially optimized. According to embodiments of the invention, the wet etching process may enable satisfactory surface flatness of sides of trench structures. Therefore, surface flatness of magnetic elements positioned on the sides of the trench structures may be substantially optimized. Advantageously, satisfactory yield associated with the manufacturing of magnetoresistive sensors may be achieved, and/or the associated cost may be minimized.

The above summary is related to some of many embodiments of the invention disclosed herein and is not intended to limit the scope of the invention.

DETAILED DESCRIPTION

Figure 1:
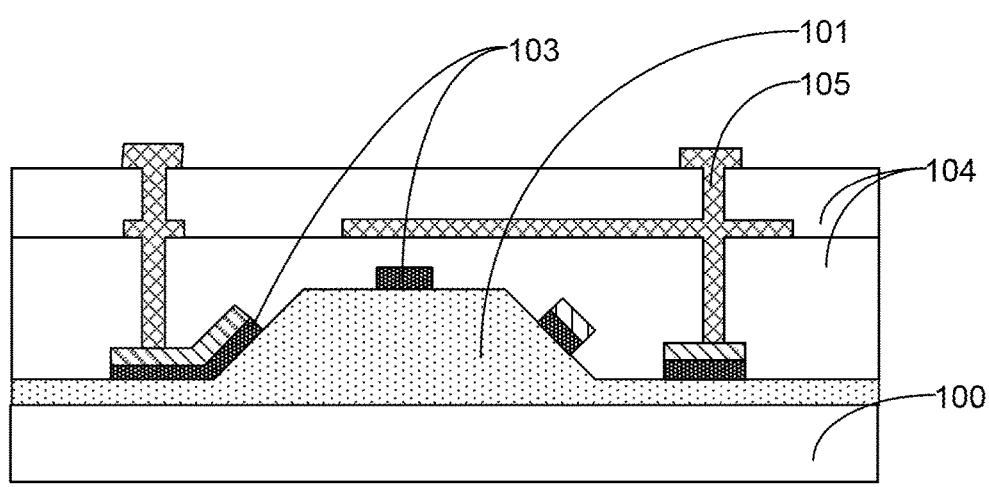
FIG. 1 shows a schematic diagram (e.g., a schematic cross-sectional view) that illustrates elements and/or structures of a magnetoresistive sensor in accordance with one or more embodiments of the present invention.

Example embodiments of the present invention are described with reference to the accompanying drawings. As those skilled in the art would realize, the described embodiments may be modified in various different ways, all without departing from the spirit or scope of the present invention. Embodiments of the present invention may be practiced without some or all of these specific details. Well known process steps and/or structures may not have been described in detail in order to not unnecessarily obscure the present invention.

The drawings and description are illustrative and not restrictive. Like reference numerals may designate like (e.g., analogous or identical) elements in the specification. Repetition of description may be avoided.

The relative sizes and thicknesses of elements shown in the drawings are for facilitate description and understanding, without limiting the present invention. In the drawings, the thicknesses of some layers, films, panels, regions, etc., may be exaggerated for clarity.

Illustrations of example embodiments in the figures may represent idealized illustrations. Variations from the shapes illustrated in the illustrations, as a result of, for example, manufacturing techniques and/or tolerances, may be possible. Thus, the example embodiments should not be construed as limited to the shapes or regions illustrated herein but are to include deviations in the shapes. For example, an etched region illustrated as a rectangle may have rounded or curved features. The shapes and regions illustrated in the figures are illustrative and should not limit the scope of the example embodiments.

Although the terms "first", "second", etc. may be used herein to describe various elements, these elements, should not be limited by these terms. These terms may be used to distinguish one element from another element. Thus, a first element discussed below may be termed a second element without departing from the teachings of the present invention. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

If a first element (such as a layer, film, region, or substrate) is referred to as being "on", "neighboring", "connected to", or "coupled with" a second element, then the first element can be directly on, directly neighboring, directly connected to, or directly coupled with the second element, or an intervening element may also be present between the first element and the second element. If a first element is referred to as being "directly on", "directly neighboring", "directly connected to", or "directed coupled with" a second element, then no intended intervening element (except environmental elements such as air) may also be present between the first element and the second element.

Spatially relative terms, such as "beneath", "below", "lower", "above", "upper", and the like, may be used herein for ease of description to describe one element or feature's spatial relationship to another element(s) or feature(s) as illustrated in the figures. It will be understood that the spatially relative terms may encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein should be interpreted accordingly.

The terminology used herein is for the purpose of describing particular embodiments and is not intended to limit the invention. As used herein, the singular forms, "a", "an", and "the" may indicate plural forms as well, unless the context clearly indicates otherwise. The terms "includes" and/or "including", when used in this specification, may specify the presence of stated features, integers, steps, operations, elements, and/or components, but may not preclude the presence or addition of one or more other features, integers, steps, operations, elements, components, and/or groups.

Unless otherwise defined, terms (including technical and scientific terms) used herein have the same meanings as commonly understood by one of ordinary skill in the art related to this invention. Terms, such as those defined in commonly used dictionaries, should be interpreted as having meanings that are consistent with their meanings in the context of the relevant art and should not be interpreted in an idealized or overly formal sense unless expressly so defined herein.

The term "connect" may mean "electrically connect". The term "insulate" may mean "electrically insulate". The term "conductive" may mean "electrically conductive"

Unless explicitly described to the contrary, the word "comprise" and variations such as "comprises", "comprising", "include", or "including" may imply the inclusion of stated elements but not the exclusion of other elements.

Various embodiments, including methods and techniques, are described in this disclosure. Embodiments of the invention may also cover an article of manufacture that includes a non-transitory computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out operations pertaining to embodiments of the invention. Examples of such apparatus include a general purpose computer and/or a dedicated computing device when appropriately programmed and may include a combination of a computer/computing device and dedicated/programmable hardware circuits (such as electrical, mechanical, and/or optical circuits) adapted for the various operations pertaining to embodiments of the invention.

FIG. 1 shows a schematic diagram (e.g., a schematic cross-sectional view) that illustrates elements and/or structures of a magnetoresistive sensor (e.g., a three-dimensional magnetoresistive sensor) in accordance with one or more embodiments of the present invention.

The magnetoresistive sensor may include a substrate 100 (e.g., a semiconductor substrate), a silicon dioxide member 101 protruding over the substrate, magnetic elements 103 positioned on the silicon dioxide member 101, one or more insulating layers 104 covering the magnetic elements 103, and metal interconnect elements 105 positioned inside the insulating layer(s) 104. The magnetic elements 103 may include elements respectively corresponding to three dimensions (e.g., an X-axis direction, a Y-axis direction, and a Z-axis direction), such that the magnetoresistive sensor may detect and/or measure magnetic fields in the three dimensions.

A method for manufacturing the magnetoresistive sensor may include a photoresist reflow process, a dry etching process, and a borophosphosilicate glass (BPSG) reflow process.

FIG. 2, FIG. 3A, FIG. 3B, FIG. 4, FIG. 5, FIG. 6, FIG. 7, FIG. 8, FIG. 9, FIG. 10, and FIG. 11 show schematic diagrams (e.g., schematic cross-sectional views and a schematic top view) that illustrate elements and/or structures formed in a method for manufacturing a magnetoresistive sensor in accordance with one or more embodiments of the present invention. FIG. 12 shows a schematic diagram (e.g., a schematic cross-sectional view) that illustrates elements and/or structures of a magnetoresistive sensor in accordance with one or more embodiments of the present invention. FIG. 13 shows a flowchart that illustrates steps in a method for manufacturing a magnetoresistive sensor in accordance with one or more embodiments of the present invention.

Referring to FIG. 13, the method may include steps S1301, S1302, and S1303.

Figure 2:
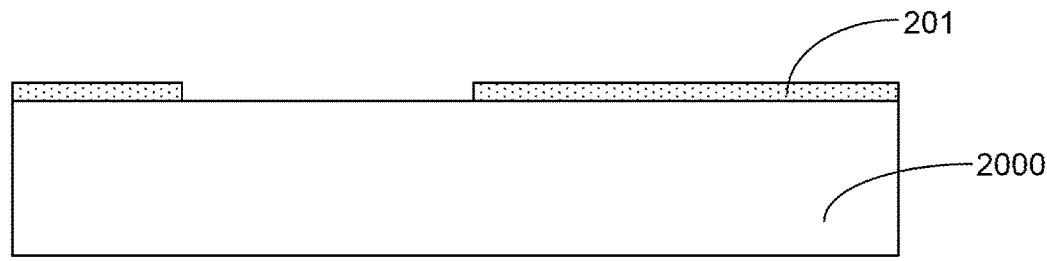
FIG. 2, FIG. 3A, FIG. 3B, FIG. 4, FIG. 5, FIG. 6, FIG. 7, FIG. 8, FIG. 9, FIG. 10, and FIG. 11 show schematic diagrams (e.g., schematic cross-sectional views) that illustrate elements and/or structures formed in a method for manufacturing a magnetoresistive sensor in accordance with one or more embodiments of the present invention.

Referring to FIG. 13 and FIG. 2, the step S1301 may include preparing a substrate material member 2000. The substrate material member 2000 may be formed of a semiconductor material.

Referring to FIG. 13, FIG. 2, FIG. 3A, FIG. 3B, and FIG. 4, subsequent to the step S1301, the step S1302 may include forming an etched trench structure 2021 in a substrate 2001 (and forming a trench structure 202 in a composite substrate 200).

Referring to FIG. 2 (a schematic cross-sectional view), the step S1302 may include forming a mask material layer on the substrate material member 2000 and etching the mask material to form a mask 201 (e.g., a hard mask) that has an opening and is positioned on the substrate material member 2000. The mask material layer may be formed through a deposition process and/or one or more of other suitable processes. The mask material layer and the resulted mask 201 may be formed of silicon oxide (e.g., silicon dioxide or plasma enhanced silicon dioxide). The opening may have a rectangular shape.

Figure 3A:
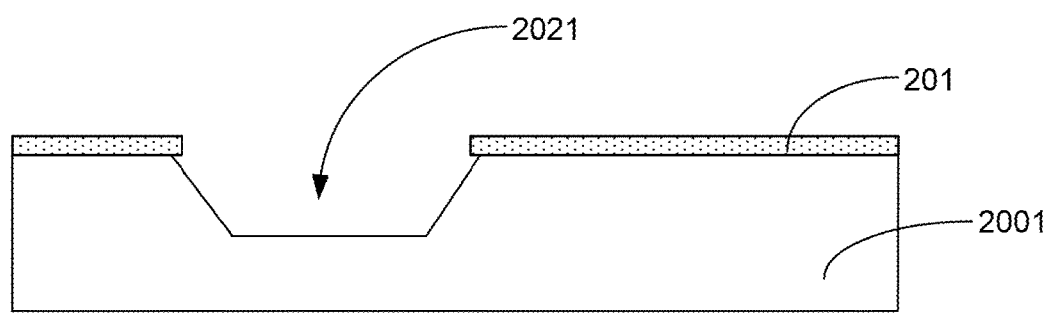
Figure 3B:
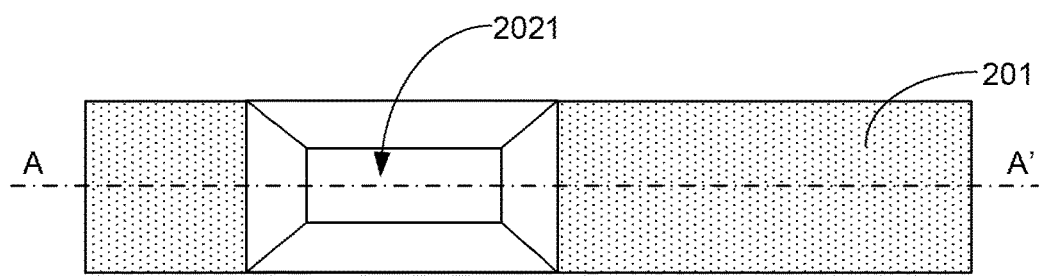

Referring to FIG. 2, FIG. 3A, and FIG. 3B (wherein FIG. 3B is a schematic top view and wherein FIG. 3A is a schematic cross-sectional view taken along the line AA'), the step S1302 may include performing a wet etching process on the substrate material member 2000 (with the mask 201 positioned thereon) to form a substrate 2001 that has an etched trench structure 2021. The opening of the etched trench structure 2021 may be wider than the bottom side, or a first side, of the etched trench structure 2021. A cross-section of the etched trench structure 2021 may have an inverted-trapezoid shape.

The etched trench structure 2021 may have the first side (e.g., the bottom side illustrated in FIG. 3A), a second side (e.g., the left side illustrated in FIG. 3A), and a third side (e.g., the right side illustrated in FIG. 3A). The second side may be connected through the first side to the third side, and/or the first side may be connected between the second side and the third side.

The second side may be at a first obtuse angle with respect to a side (e.g., the bottom side) of the substrate 2001. The third side may be at a second obtuse angle with respect to the side (e.g., the bottom side) of the substrate 2001. A magnitude of the first obtuse angle may be in a range of 120 degrees to 140 degrees. A magnitude of the second obtuse angle may be in a range of 120 degrees to 140 degrees. The second side of the etched trench structure 2021 may be at an angle in a range of 120 degrees to 140 degrees with respect to the first side of the etched trench structure 2021. The third side of the etched trench structure 2021 may be at an angle in a range of 120 degrees to 140 degrees with respect to the first side of the etched trench structure 2021.

The wet etching process may enable satisfactory control of the first obtuse angle, the second obtuse angle, and/or other inclination parameters related to sides of the etched trench structure 2021, which may significantly affect orientations of subsequently formed magnetic elements of the magnetoresistive sensor. Advantageously, orientations of magnetic elements of the magnetoresistive sensor may satisfy required specifications, and the manufacturing yield related to the magnetoresistive sensor may be satisfactory.

The wet etching process may be performed substantially along one or more desirable crystal orientations of the substrate material member 2000. Therefore, sides of the etched trench structure 2021, on which magnetic elements of the magnetoresistive sensor may be subsequently formed (with or without an intervening layer), may be satisfactorily flat and/or smooth, e.g., with a surface roughness less than or equal to 20 angstroms. As a result, surface flatness of magnetic elements of the magnetoresistive sensor may satisfy required specifications, and no or minimum additional flattening processes for the magnetic elements may be needed. Advantageously, the manufacturing yield related to the magnetoresistive sensor may be satisfactory, and the manufacturing cost related to the magnetoresistive sensor may be minimized.

The wet etching process may include etching the substrate material member 2000 using tetramethylammonium hydroxide (TMAH). TMAH etching may provide desirable crystal orientation selectivity, such that satisfactory inclination parameters and flatness of sides of the etched trench structure 2021 may be ensured. The wet etching process may be performed on the substrate material member 2000 for a duration in a range of 29 minutes and 31 minutes, such as a duration of 30 minutes.

Figure 4:
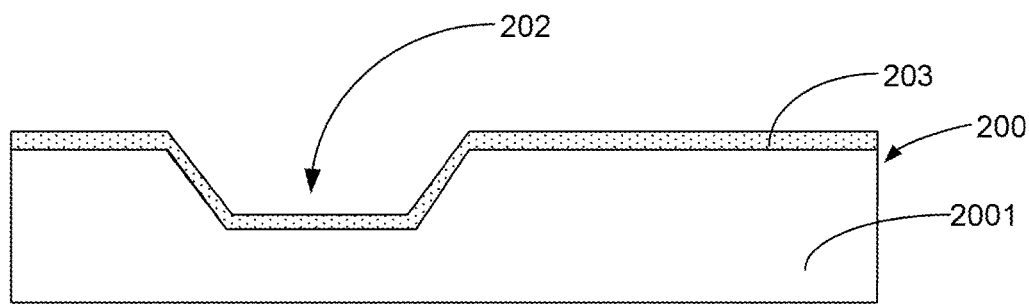

Referring to FIG. 3A, FIG. 3B, and FIG. 4 (a schematic cross-sectional view), the step S1302 may include removing the mask 201 after the wet etching process. The mask 201 may be removed using dilute hydrofluoric acid (DHF) through a washing process. In an embodiment, the wet etching process may not result in significant undercut at edges of the mask 201, and the mask 201 may be retained as a protective layer without being removed. The protective layer may protect the substrate 2001 against contamination and/or corrosion.

Referring to FIG. 3A and FIG. 4, the S1302 may include providing (or forming) an protective layer 203 on the substrate 2001. The protective layer 203 may protect the substrate 2001 against contamination and/or corrosion. The protective layer 203 may be a silicon oxide layer. The protective layer 203 may covers sides (e.g., the first side, the second side, and the third side) of the etched trench structure 2021 to form the trench structure 202. The substrate 2001 and the protective layer 203 may form a composite substrate 200. Magnetic elements may be subsequently formed on the protective layer 203.

The protective layer 203 may be formed through a thermal oxidation process performed on the substrate 2001, wherein a portion (e.g., surface portion) of the substrate 2001 may be oxidized to form the protective layer 203. A thickness (perpendicular to a side or surface of the etched trench structure 2021) of the protective layer 203 may be in a range of 0.5 micrometer (or micron) to 2 micrometers, such as 1 micrometer. The protective layer 203 may mitigate issues potentially caused by undercut resulted from the wet etching process.

In an embodiment, the wet etching process may not result in significant undercut at edges of the mask 201, the mask 201 may be retained as an protective layer without being removed, and the protective layer 203 may not be formed.

The trench structure may have features and advantages analogous to features and advantages associated with the etched trench structure 2021. The opening of the trench structure 202 may be wider than the bottom side, or a first side, of the trench structure 202. A cross-section of the trench structure 202 may have an inverted-trapezoid shape.

The trench structure 202 may have the first side (e.g., the bottom side corresponding to a first/bottom portion of the insulting layer 203 illustrated in FIG. 4), a second side (e.g., the left side corresponding to a second portion of the insulting layer 203 illustrated in FIG. 4), and a third side (e.g., the right side corresponding to a third portion of the insulting layer 203 illustrated in FIG. 4). The second side may be connected through the first side to the third side, and/or the first side may be connected between the second side and the third side.

The second side may be at the first obtuse angle with respect to the side (e.g., the bottom side) of the substrate 2001. The third side may be at the second obtuse angle with respect to the side (e.g., the bottom side) of the substrate 2001. A magnitude of the first obtuse angle may be in a range of 120 degrees to 140 degrees. A magnitude of the second obtuse angle may be in a range of 120 degrees to 140 degrees. The second side of the trench structure 202 may be at an angle in a range of 120 degrees to 140 degrees with respect to the first side of the trench structure 202. The third side of the trench structure 202 may be at an angle in a range of 120 degrees to 140 degrees with respect to the first side of the trench structure 202.

The previously-discussed wet etching process and the etched trench structure 2021 structure may result in desirable configurations of the first obtuse angle, the second obtuse angle, and/or other inclination parameters related to sides of the trench structure 202, which may significantly affect orientations of subsequently formed magnetic elements of the magnetoresistive sensor. Advantageously, orientations of magnetic elements of the magnetoresistive sensor may satisfy required specifications, and the manufacturing yield related to the magnetoresistive sensor may be satisfactory.

Since the structure of the trench structure 202 may be substantially similar to or identical to the structure of the etched trench structure 2021, sides of the trench structure 202, on which magnetic elements of the magnetoresistive sensor may be subsequently formed (with or without an intervening layer), may be satisfactorily flat and/or smooth, e.g., with a surface roughness less than or equal to 20 angstroms. As a result, surface flatness of magnetic elements of the magnetoresistive sensor may satisfy required specifications, and no or minimum additional flattening processes for the magnetic elements may be needed. Advantageously, the manufacturing yield related to the magnetoresistive sensor may be satisfactory, and the manufacturing cost related to the magnetoresistive sensor may be minimized.

Referring to FIG. 13, FIG. 5, FIG. 6, and FIG. 7, subsequent to the step S1302, the step S1303 may include providing (or forming) magnetic elements 204 on the bottom side (or the first side) and inclined sides (e.g., the second side and the third side) of the trench structure 202 or, in an embodiment without the protective layer 203, of the etched trench structure 2021.

Figure 7:
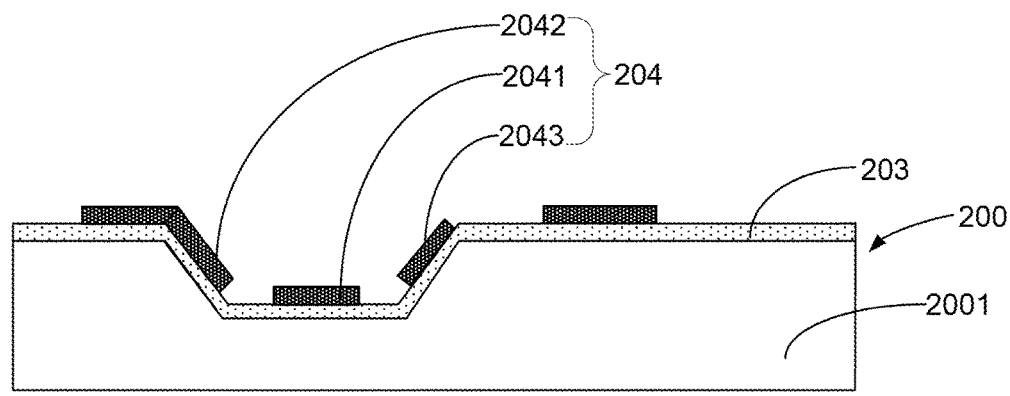

Referring to FIG. 7 (a schematic cross-sectional view), the magnetic elements 204 may include a first magnetic element 2041 positioned on (and directly contacting) the first side (i.e., a bottom side) of the trench structure 202, a second magnetic element 2042 positioned on (and directly contacting) the second side (an inclined side) of the trench structure 202, and a third magnetic element 2043 positioned on (and directly contacting) the third side (another inclined side) of the trench structure 202. In an embodiment, the protective layer 203 may not be formed, and the first magnetic element 2041, the second magnetic element 2042, and the third magnetic element 2043 may be respectively positioned on (and respectively directly contact) the first side, second side, and third side of the etched trench structure 2021.

The first magnetic element 2041 may be positioned closer to the side (e.g., bottom side) of the composite substrate 200 than each of the second magnetic element 2042 and the third magnetic element 2043. The first magnetic element 2041 may correspond to a first Cartesian coordinate direction (e.g., the X-axis direction). The second magnetic element 2042 may correspond to a second Cartesian coordinate direction (e.g., the Y-axis direction). The third magnetic element 2043 may correspond to a third Cartesian coordinate direction (e.g., the Z-axis direction).

The substrate 2001 may be a semiconductor substrate. At least one of the first magnetic element 2042, the second magnetic element 2042, and the third magnetic element 2043 may be positioned between two semiconductor portions of the substrate 2001, e.g., the left portion and right portion of the substrate 2001 illustrated in FIG. 7.

The first magnetic element 2041, at least a portion of the second magnetic element 2042, and at least a portion of the third magnetic element 2043 may be positioned between two portions of a protective layer 203, e.g., the left inside-trench portion and right inside-trench portion of the protective layer 203 illustrated in FIG. 7. The two portions of the protective layer 203 may be positioned between the two semiconductor portions of the substrate 2001.

The second magnetic element 2042 may include a first portion and a second portion. The first portion (e.g., the inclined portion of the second magnetic element 2042 illustrated in FIG. 7) may be positioned on the second side of the trench structure 202. The second portion (e.g., the horizontal portion of the second magnetic element 2042 illustrated in FIG. 7) may be positioned outside the trench structure 202, may be directly connected the first portion, and may be at a third obtuse angle with respect to the first portion. A magnitude of the third obtuse angle may be in a range of 120 degrees to 140 degrees. The second portion of the second magnetic element 2042 may be substantially parallel to at least one of the first magnetic element 2041 and the bottom side of the substrate 2001 (which may be the bottom side of the composite substrate 200).

Figure 5:
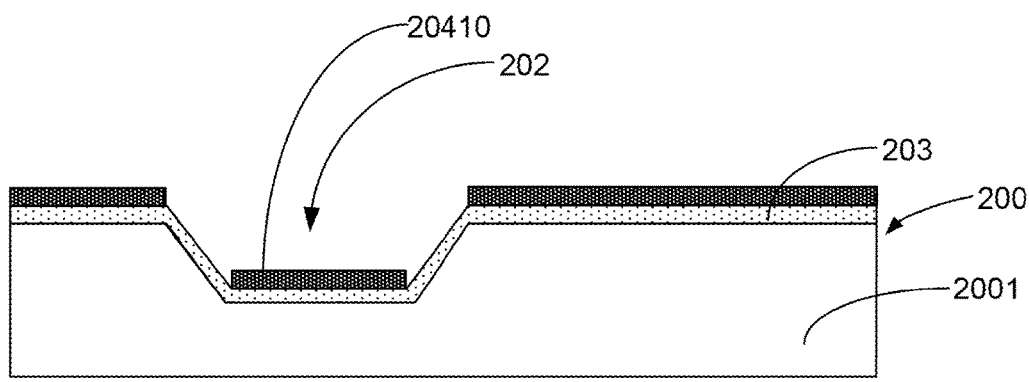

Referring to FIG. 4 and FIG. 5 (schematic cross-sectional views), the step S1303 may include the following steps: forming a first photoresist on the substrate 2001 and/or the protective layer 203 of the composite substrate 200; exposing and developing the first photoresist to form a first remaining photoresist that may define a first location (which may include a horizontal location at the bottom side of the etched trench structure 2021 or the trench structure 202); providing a first magnetic material layer on the first set of locations and on the first remaining photoresist; and removing a portion of the first magnetic material layer that has been provided on the first remaining photoresist to form a first magnetic material member 20410 at the first location. Magnetic material members analogous to the first magnetic material member may be formed when the first magnetic material member is formed.

The removal of the portion of the portion of the first magnetic material layer may be performed through a lift-off process (or stripping process). In the lift-off process, a solvent may be provided to remove the first remaining photoresist, and the portion of the first magnetic material layer that has been provided on the first remaining photoresist may be removed along with the first remaining photoresist. As a result, the remaining portion of the first magnetic material layer may form the first magnetic material member 20410 at the first location.

Figure 6:
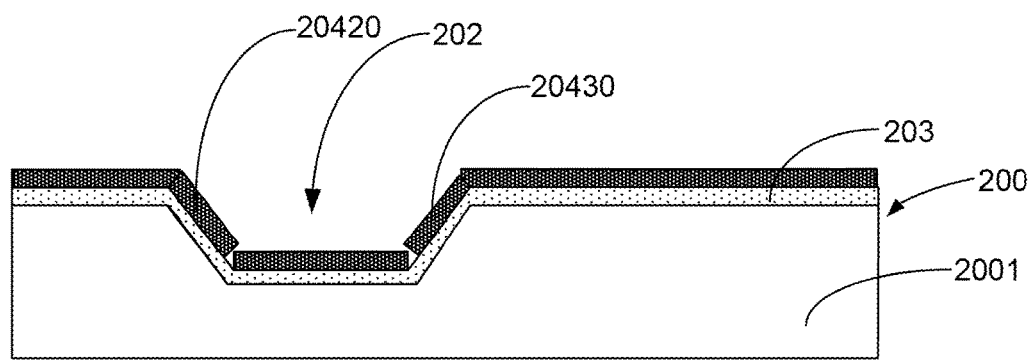

Referring to FIG. 5 and FIG. 6 (schematic cross-sectional views), the step S1303 may further include the following steps: forming a second photoresist on the substrate 2001 and/or the protective layer 203 of the composite substrate 200; exposing and developing the second photoresist to form a second remaining photoresist that may define a second location (which may include a location at the left inclined side of the etched trench structure 2021 or the trench structure 202) and a third location (which may include a location at the right inclined side of the etched trench structure 2021 or the trench structure 202); providing a second magnetic material layer on the second location, on the third location, and on the second remaining photoresist; removing (e.g., through a lift-off process) a portion of the second magnetic material layer that is provided on the second remaining photoresist to form a second magnetic material member 20420 at the second location and to form a third magnetic material member 20430 at the third location. Magnetic material members analogous to the second magnetic material member and the third magnetic material member may be formed when the second magnetic material member and the third magnetic material member are formed.

A thickness (perpendicular to a side of the etched trench structure 2021 or a side of the trench structure 202) of one or more of the first magnetic material member 20410, the second magnetic material member 20420, and the third magnetic material member 20430 may be in a range of 190 microns to 210 microns, such as 200 microns. One or more of the first magnetic material layer, the second magnetic material layer, the first magnetic material member 20410, the second magnetic material member 20420, and the third magnetic material member 20430 may be formed of a nickel-iron alloy and/or one or more of other suitable materials. The first magnetic element 2041 may be a portion of the first magnetic material member 20410, which may be a portion of the first magnetic material layer. The second magnetic element 2042 and the third magnetic element 2043 may be portions of the second magnetic material member 20420 and the third magnetic material member 20430, which may be portions of a second magnetic material layer.

Referring to FIG. 6 and FIG. 7 (schematic cross-sectional views), the step S1303 may further include etching the first magnetic material member 20410, the second magnetic material member 20420, and the third magnetic material member 20430 in a same etching process to form the first magnetic element 2041, the second magnetic element 2042, and the third magnetic element 2043. Analogous magnetic elements may be formed in the same process when the first magnetic element 2041, the second magnetic element 2042, and the third magnetic element 2043 are formed. The etching process may include ion beam etching. The etching process may optimize configurations of the magnetic elements 204 to satisfy required specifications, such that the manufacturing yield associated with the magnetoresistive sensor may be maximized.

In an embodiment, the step S1303 may not include the etching process; the first magnetic material member 20410, the second magnetic material member 20420, and the third magnetic material member 20430 may function as the magnetic elements 204 and may satisfy specifications.

Figure 8:
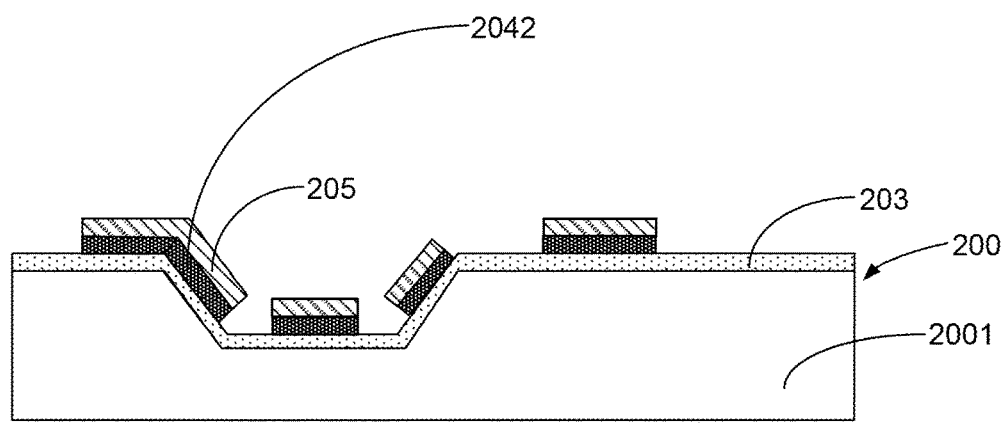

Referring to FIG. 7 and FIG. 8 (schematic cross-sectional views), the method may include providing metal elements 205 on the magnetic elements 204. The metal elements 205 may include a metal element 205 that directly contacts the second magnetic element 2042. A portion (e.g., a horizontal portion) of the metal element 205 may be positioned outside the trench structure 202 (and/or the etched trench structure 2021). Another portion (e.g., an inclined portion) of the metal element 205 may be positioned inside the trench structure 202 (and/or the etched trench structure 2021). The metal elements 205 may be formed of one or more of titanium, copper, aluminum, etc.

Formation of the metal elements 205 may include the following steps: forming a photoresist on the substrate 2001 (and/or the composite substrate 200); exposing and developing the photoresist to form a remaining photoresist that may define locations for the metal elements, wherein the locations may correspond to the magnetic elements 204; forming (e.g., through an electron beam evaporation process) a metal layer on the locations and the remaining photoresist; and removing (e.g., through a stripping process) the remaining photoresist along with a portion of the metal layer formed thereon, such that the remaining portions of the metal layer form the metal elements 205 on the magnetic elements 204.

Figure 9:
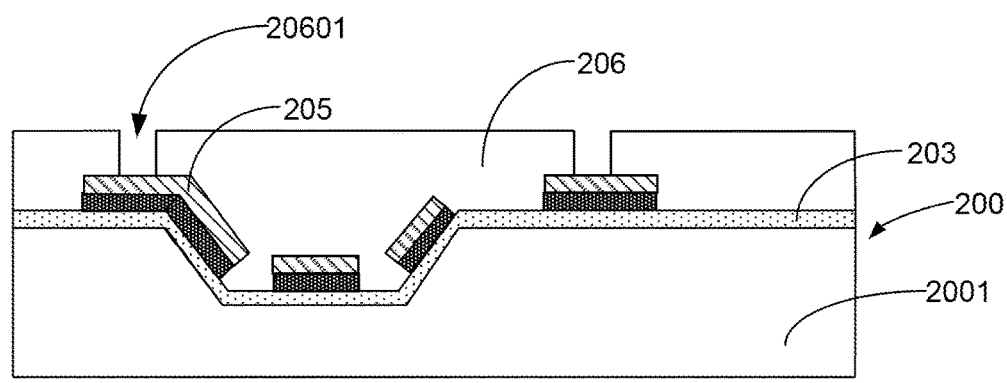
Figure 10:
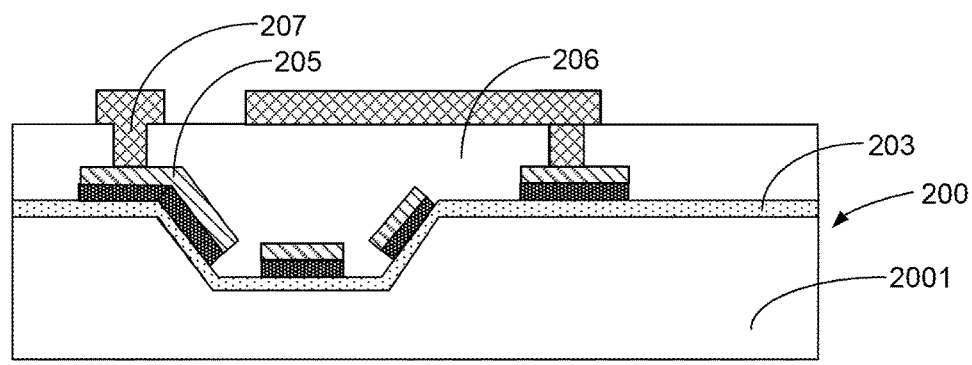

Referring to FIG. 8, FIG. 9, and FIG. 10 (schematic cross-sectional views), the method may include the following steps: forming (e.g., through a deposition process) a dielectric layer 206 on the substrate 2001 (and/or the composite substrate 200); forming (e.g., through an etching process, such as a dry etching process) a contact hole 20601 in the dielectric layer 206; and forming a conductive interconnect 207 that may be at least partially positioned inside the contact hole 20601 and may directly contact the portion of the metal element 205 that is positioned outside the etched trench structure 2021 (and the trench structure 202).

The dielectric layer 206 may be formed of one or more of silicon nitride, etc. A minimum thickness of the dielectric layer may be in a range of 6 microns to 7 microns. A maximum thickness of the dielectric layer may be in a range of 6 microns to 7 microns.

The conductive interconnect 207 may be formed of one or more of copper, etc. A length (perpendicular to the bottom of the substrate 2001) of the conductive interconnect 207 may be in a range of 3 microns to 5 microns, such as 4 microns.

Figure 11:
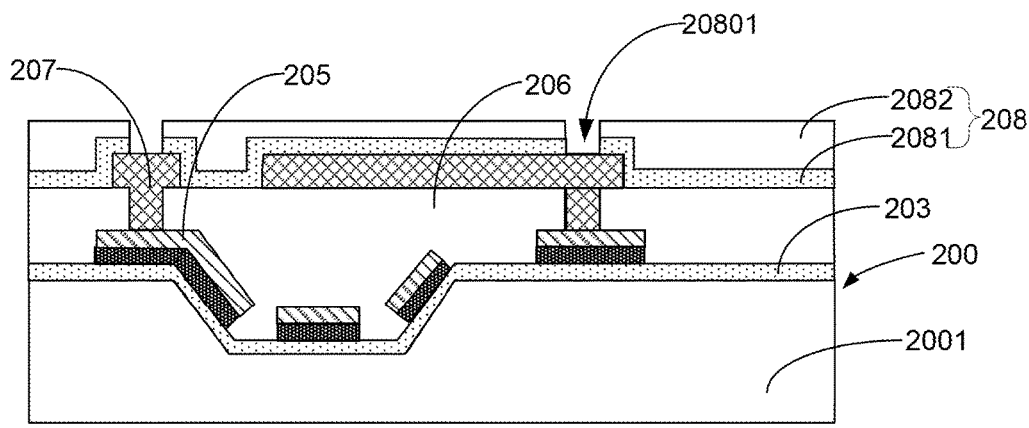
Figure 12:
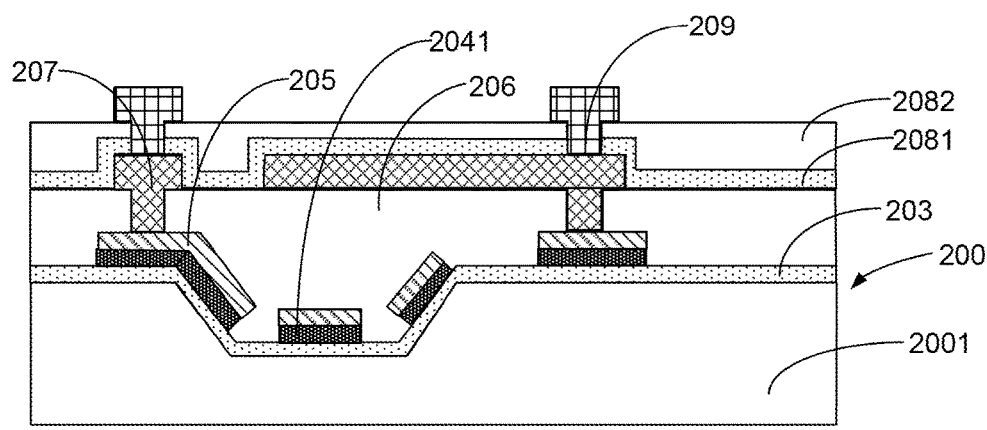
FIG. 12 shows a schematic diagram (e.g., a schematic cross-sectional view) that illustrates elements and/or structures of a magnetoresistive sensor in accordance with one or more embodiments of the present invention.
Figure 13:
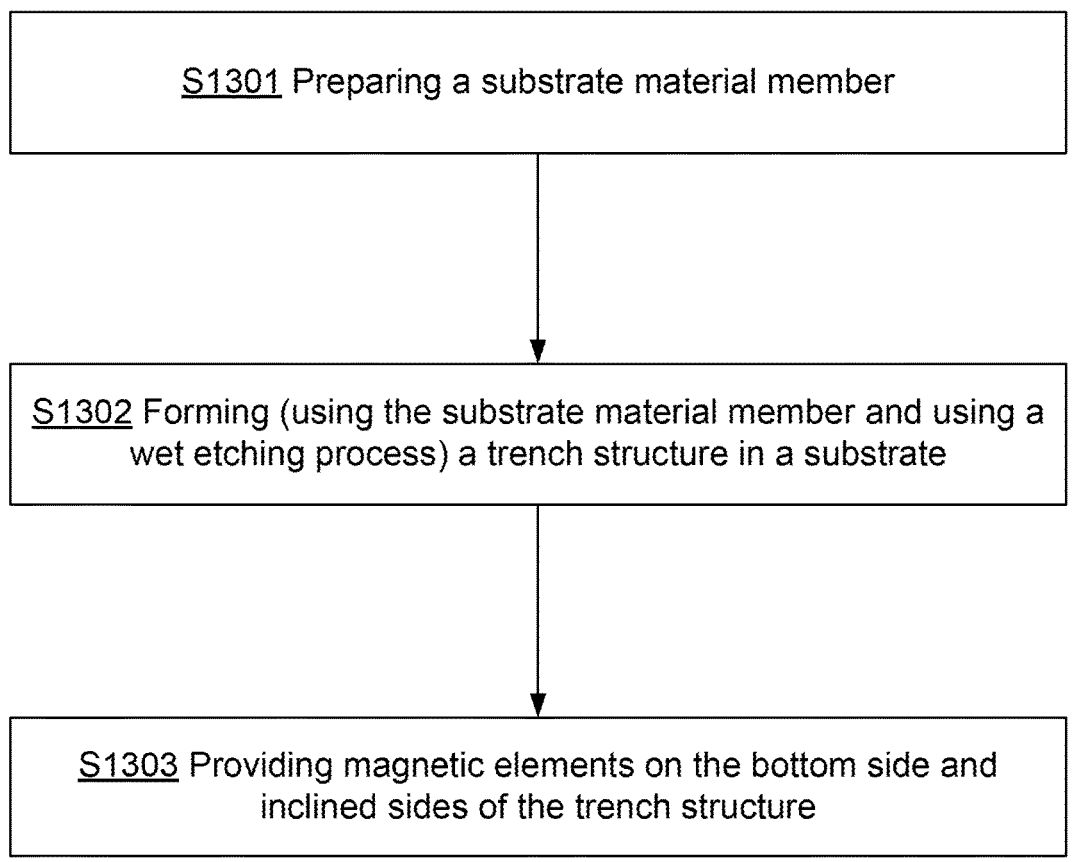
FIG. 13 shows a flowchart that illustrates steps in a method for manufacturing a magnetoresistive sensor in accordance with one or more embodiments of the present invention.

Referring to FIG. 10, FIG. 11, and FIG. 12 (schematic cross-sectional views), the method may include the following steps: forming (e.g., through one or more deposition processes) a dielectric layer 208 on the dielectric layer 206; forming (e.g., through an etching process, such as a dry etching process) a contact hole 20801 in the dielectric layer 208; and forming a conductive pad 209 that may be at least partially positioned inside the contact hole 20801 and may directly contact the conductive interconnect 207.

The dielectric layer 208 may have a single-layer structure or a multilayer structure. The dielectric layer 208 may include a dielectric layer 2081 and a dielectric layer 2082. The dielectric layer 2081 may be positioned between the dielectric layer 206 and the dielectric layer 2082. The dielectric layer 2081 may contact the conductive interconnect 207. A portion of the dielectric layer 2081 may be positioned between the conductive interconnect 207 and the dielectric layer 2082 in a vertical direction (i.e., a direction perpendicular to the bottom side of the substrate 2001). A portion of the dielectric layer 2081 and a portion of the dielectric layer 2082 may be positioned between the conductive pad 209 and the conductive interconnect 207.

The dielectric layer 2081 may be silicon oxide layer. A minimum vertical thickness of the dielectric layer 2081 (i.e., a vertical thickness of the thinnest portion of the dielectric layer 2081) may be in a range of 0.4 micron to 0.6 micron, such as 0.5 micron.

The dielectric layer 2082 may be silicon nitride layer. A maximum vertical thickness of the dielectric layer 2082 (i.e., a vertical thickness of the thickest portion of the dielectric layer 2082) may be in a range of 3 microns to 5 microns, such as 4 microns.

The conductive pad 209 may be formed through one or more of a deposition process, an etching process, etc. The conductive pad 209 may be formed of one or more of aluminum, etc. A vertical length (or thickness) of the conductive pad 209 may be in a range of 9000 angstroms to 11000 angstroms, such as 10000 angstroms.

According to embodiments of the invention, the wet etching process may enable satisfactory control of inclination angles of sides of etched trench structures (and of sides of subsequently formed trench structures). Therefore, orientations of magnetic elements positioned on sides of trench structures may be substantially optimized. According to embodiments of the invention, the wet etching process may enable satisfactory surface flatness of sides of trench structures. Therefore, surface flatness of magnetic elements positioned on the sides of the trench structures may be substantially optimized. Advantageously, satisfactory yield associated with the manufacturing of magnetoresistive sensors may be achieved, and/or the associated cost may be minimized.

FIG. 12 shows a schematic diagram (e.g., a schematic cross-sectional view) that illustrates elements and/or structures of a magnetoresistive sensor in accordance with one or more embodiments of the present invention. The magnetoresistive sensor may have one or more elements, structures, features, and/or advantages discussed with reference to one or more of FIGS. 1 to 13.

Figure 14:
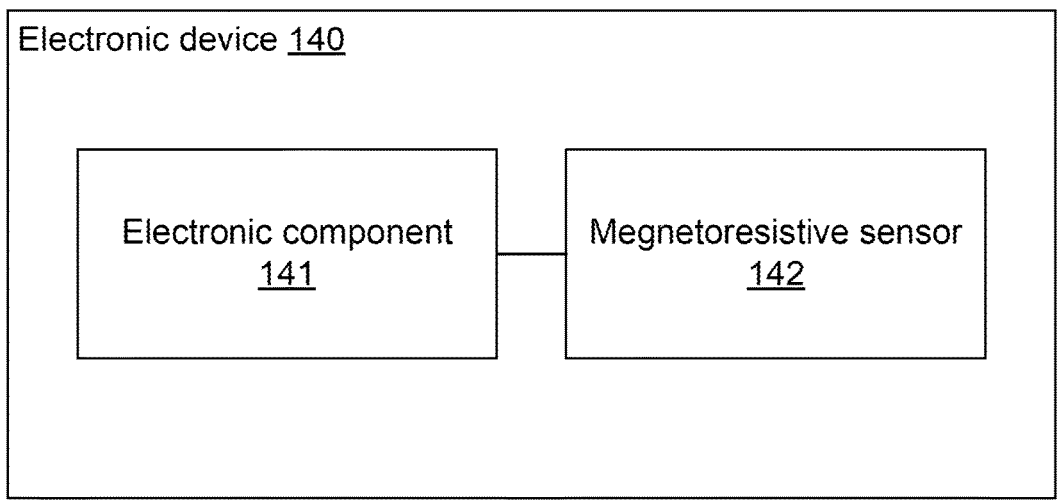
FIG. 14 shows a schematic block diagram that illustrates elements of an electronic device in accordance with one or more embodiments of the present invention.

FIG. 14 shows a schematic block diagram that illustrates elements of an electronic device 1400 in accordance with one or more embodiments of the present invention. The electronic device may include an electronic component 1401 and a magnetoresistive sensor 1402 that is electrically connected to the electronic component 1401. The magnetoresistive sensor 1402 may have one or more elements, structures, features, and/or advantages discussed with reference to one or more of FIGS. 1 to 13.

In an embodiment, the electronic device 1400 may be or may include one or more of a mobile phone, a tablet computer, a notebook computer, a netbook, a game console, a television, a video compact disc (VCD) player, a digital video disc (DVD) player, a navigation device, a camera, a camcorder, a voice recorder, an MP3 player, an MP4 player, a portable game device, etc.

In an embodiment, the electronic device 1400 may be or may include an intermediate product (e.g., a mobile phone main board) or module that may have one or more of the features and advantages discussed above.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A magnetoresistive sensor comprising:
a substrate that has a trench structure, wherein the trench structure has a first side, a second side, and a third side, wherein the second side is connected through the first side to the third side, wherein the second side is at a first obtuse angle with respect to a side of the substrate, and wherein the third side is at a second obtuse angle with respect to the side of the substrate;
a first magnetic element, which contacts the first side of the trench structure;
a second magnetic element, which contacts the second side of the trench structure; and
a third magnetic element, which contacts the third side of the trench structure, wherein the first, the second, and the third magnetic elements are spaced apart from each other.

2. The magnetoresistive sensor of claim 1, wherein at least one of the first magnetic element, the second magnetic element, and the third magnetic element is positioned between two semiconductor portions of the substrate.

3. The magnetoresistive sensor of claim 1, wherein the second side is at an angle in a range of 120 degrees to 140 degrees with respect to at least one of the side of the substrate and the first side of the trench structure.

4. The magnetoresistive sensor of claim 1, wherein the first magnetic element is positioned between two portions of a protective layer, and wherein the two portions of the protective layer are positioned between two semiconductor portions of the substrate.

5. The magnetoresistive sensor of claim 1, wherein the second magnetic element includes a first portion and a second portion, wherein the first portion contacts the second side of the trench structure, and wherein the second portion is positioned outside the trench structure, is directly connected the first portion, and is at a third obtuse angle with respect to the first portion.

6. An electronic device comprising:
an electronic component; and
a magnetoresistive sensor electronically connected to the electronic component,
wherein the magnetoresistive sensor comprises a substrate, a first magnetic element, a second magnetic element, and a third magnetic element,
wherein the substrate has a trench structure,
wherein the trench structure has a first side, a second side, and a third side,
wherein the second side is connected through the first side to the third side, wherein the second side is at a first obtuse angle with respect to a side of the substrate,
wherein the third side is at a second obtuse angle with respect to the side of the substrate,
wherein the first magnetic element contacts the first side of the trench structure,
wherein the second magnetic element contacts the second side of the trench structure,
wherein the third magnetic element contacts the third side of the trench structure, and wherein the first, the second, and the third magnetic elements are spaced apart from each other.

* * * * *